US012706280B2

(12) United States Patent
Amikura et al.

(10) Patent No.: US 12,706,280 B2
(45) Date of Patent: Aug. 11, 2026

(54) DETECTION DEVICE, PROCESSING SYSTEM, AND TRANSFER METHOD

(71) Applicant: Tokyo Electron Limited, Tokyo (JP)

(72) Inventors: Norihiko Amikura, Miyagi (JP); Masatomo Kita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 316 days.

(21) Appl. No.: 17/524,950

(22) Filed: Nov. 12, 2021

(65) Prior Publication Data

US 2022/0148857 A1 May 12, 2022

(30) Foreign Application Priority Data

Nov. 12, 2020 (JP) ................................ 2020-188750
Sep. 28, 2021 (JP) ................................ 2021-157858

(51) Int. Cl.
*H01J 37/32* (2006.01)
*H10P 72/00* (2026.01)
*H10P 72/50* (2026.01)

(52) U.S. Cl.
CPC .. *H01J 37/32642* (2013.01); *H01J 37/32807* (2013.01); *H10P 72/0606* (2026.01);
(Continued)

(58) Field of Classification Search
CPC ........... H01J 37/32642; H01J 37/32807; H01J 2237/20292; H01J 2237/24578; H01J 37/32715; H01L 21/67739; H01L 21/67242; H01L 21/68; H01L 21/67259; H01L 21/67069; H01L 21/67742; H01L 21/681; H01L 21/68707; H01L 21/6873; H01L 21/67265; H01L 21/67703; H01L 21/677; H01L 21/67706; H01L 21/67718; H01L 21/67721; H01L 21/67736; H01L 21/67196; H01L 21/67748; H01L 21/67167; H01L 21/67213; H01L 21/67207; H01L 21/67219;
(Continued)

(56) References Cited

U.S. PATENT DOCUMENTS 9,446,522 B2 * 9/2016 Mazzocco ............ B25J 15/0014
2005/0205209 A1 * 9/2005 Mosden ............ H01L 21/67069
156/345.31
(Continued)

FOREIGN PATENT DOCUMENTS

CN 109983569 A 7/2019
JP 2004-47654 A 2/2004
(Continued)

*Primary Examiner* — Christina A Riddle
(74) *Attorney, Agent, or Firm* — XSENSUS LLP

(57) ABSTRACT

There is provided a detection device for detecting position misalignment of an object to be transferred with respect to a transfer mechanism. The detection device comprises: an image sensor configured to capture images including the transfer mechanism and the object to be transferred which is held by the transfer mechanism; and a calculation unit configured to calculate an amount of position misalignment including misalignment in a horizontal direction and a rotational direction of the object to be transferred based on the images captured by the image sensor.

17 Claims, 9 Drawing Sheets

(52) U.S. Cl.
CPC .... *H10P 72/53* (2026.01); *H01J 2237/20292* (2013.01); *H01J 2237/24578* (2013.01)

(58) Field of Classification Search
CPC ........... H01L 21/67225; H01L 21/6723; H01L 21/67063; H01L 21/67766; H01L 21/67769; H01L 21/68764; H01L 22/20; H01L 21/683; H01L 21/6835; H01L 21/68735; H01L 21/68785; B25J 11/0095; B25J 13/08; B25J 13/089; B25J 13/088; B25J 15/0014; B25J 9/1697; B25J 19/021; B25J 19/022; B25J 19/023; B25J 19/025; B25J 9/1612; C23C 16/458; C23C 16/4581; C23C 16/4582–4585; C23C 16/45544; C23C 16/4584; G05B 19/401; G05B 2219/37002; G05B 2219/37608; G06T 2207/10004; G06T 2207/30164; G06T 7/0004; G06T 7/66; G06T 7/68; Y10S 901/02; Y10S 901/46; Y10S 901/47; H10P 72/06; H10P 72/33; H10P 72/50; H10P 72/0421; H10P 72/0606; H10P 72/3302; H10P 72/53; H10P 72/7602; H10P 72/7611
USPC .......... 356/614–640; 118/728–730; 700/213, 700/228, 229, 230; 382/151; 901/2, 47
See application file for complete search history.

(56) References Cited

U.S. PATENT DOCUMENTS

| | | | | |
|---|---|---|---|---|
| 2007/0189596 | A1* | 8/2007 | Lee | G06T 7/33 382/151 |
| 2016/0190024 | A1* | 6/2016 | Numakura | H01J 37/32009 118/712 |
| 2017/0117172 | A1* | 4/2017 | Genetti | H01L 21/68707 |
| 2018/0019107 | A1* | 1/2018 | Ishizawa | H01J 37/32807 |
| 2018/0138069 | A1 | 5/2018 | Tan et al. | |
| 2019/0355604 | A1* | 11/2019 | Kawabe | H01L 21/67196 |
| 2021/0050240 | A1* | 2/2021 | Moyama | H01L 21/67201 |

FOREIGN PATENT DOCUMENTS

| | | | |
|---|---|---|---|
| JP | 2004193344 | A | 7/2004 |
| JP | 2011108923 | A | 6/2011 |
| JP | 2015228403 | A | 12/2015 |
| KR | 20190072669 | A | 6/2019 |

* cited by examiner

DETECTION DEVICE, PROCESSING SYSTEM, AND TRANSFER METHOD

CROSS-REFERENCE TO RELATED APPLICATIONS

This application claims priority to Japanese Patent Application Nos. 2020-188750 filed on Nov. 12, 2020 and 2021-157858 filed on Sep. 28, 2021, respectively, the entire contents of which are incorporated herein by reference.

TECHNICAL FIELD

The present disclosure relates to a detection device, a processing system, and a transfer method.

BACKGROUND

There is known a positioning device configured to perform positioning by detecting a position of a peripheral portion of a semiconductor wafer while rotating the semiconductor wafer, detecting a position of an orientation flat or a notch, and detecting misalignment of a center of the semiconductor wafer from a rotation center (see, e.g., Japanese Patent Application Publication No. 2004-47654).

SUMMARY

In view of the above, the present disclosure provides a technique capable of positioning an object to be transferred without providing a positioning device.

In accordance with an aspect of the present disclosure, there is provided a detection device for detecting position misalignment of an object to be transferred with respect to a transfer mechanism. The detection device comprises: an image sensor configured to capture images including the transfer mechanism and the object to be transferred which is held by the transfer mechanism; and a calculation unit configured to calculate an amount of position misalignment including misalignment in a horizontal direction and a rotational direction of the object to be transferred based on the images captured by the image sensor.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
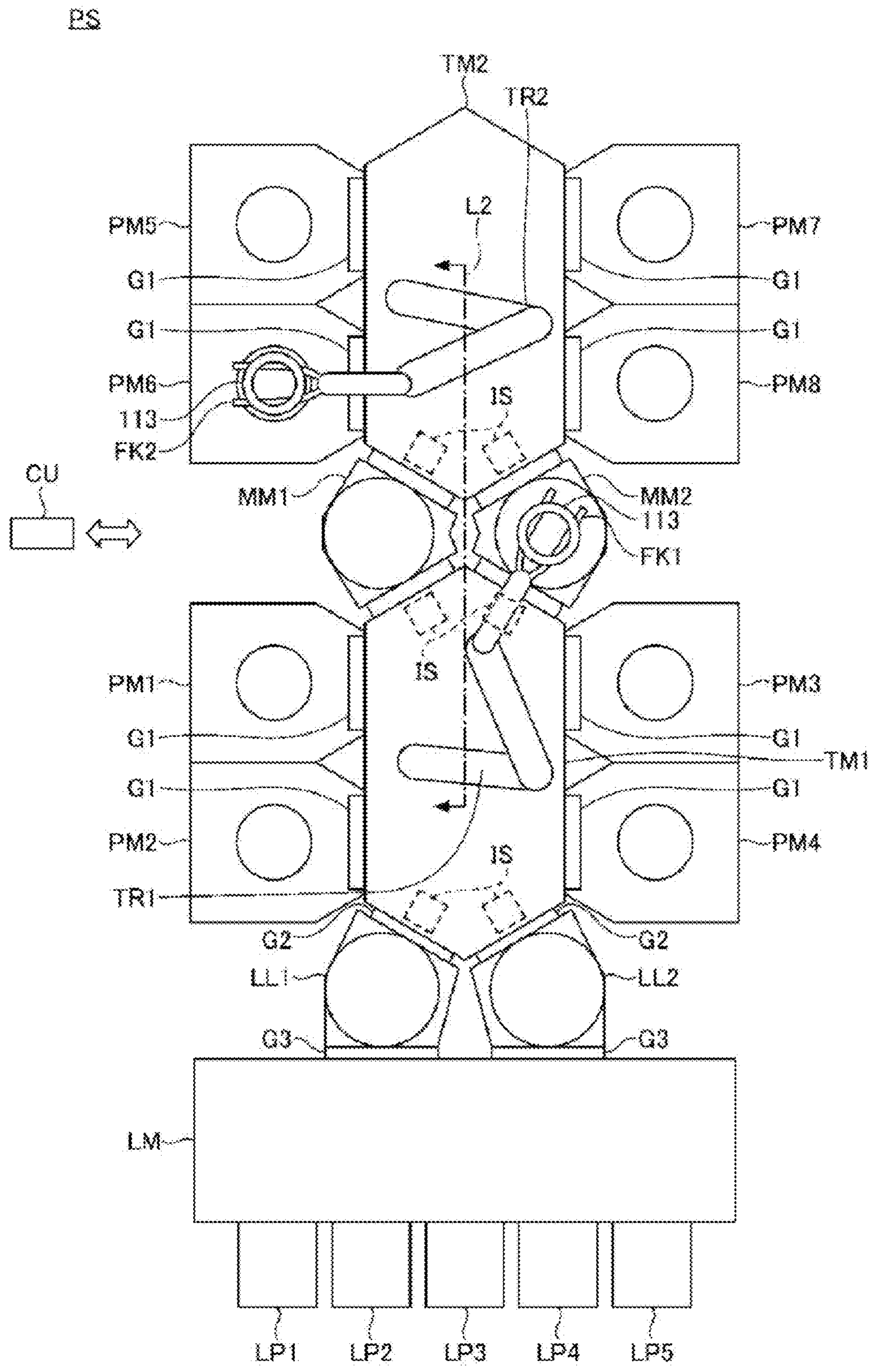
FIG. 1 shows an example of a processing system according to an embodiment.

Hereinafter, non-limiting exemplary embodiments will be described in detail with reference to the accompanying drawings. Like reference numerals will be given to like or corresponding parts throughout the drawings, and redundant description thereof will be omitted.

Processing System

An example of a processing system according to an embodiment will be described with reference to FIGS. 1, 2, 9 and 10. A processing system PS according to an embodiment can perform various processing such as plasma processing and the like on a substrate.

The processing system PS includes vacuum transfer modules TM1 and TM2, transfer intermediate chambers MM1 and MM2, process modules PM1 to PM8, load-lock modules LL1 and LL2, an atmospheric transfer modules LM, a controller CU, and the like.

Each of the vacuum transfer modules TM1 and TM2 has a substantially hexagonal shape in plan view. The process modules PM1 to PM4 are connected to two opposite side surfaces of the vacuum transfer module TM1. The load-lock modules LL1 and LL2 are connected to one of other two opposite side surfaces of the vacuum transfer module TM1, and the transfer intermediate chambers MM1 and MM2 are connected to the other side surface thereof. The side surfaces of the vacuum transfer module TM1 to which the load-lock modules LL1 and LL2 are connected are angled by the two load-lock modules LL1 and LL2. The side surfaces of the vacuum transfer module TM1 to which the transfer intermediate chambers MM1 and MM2 are connected are angled by the two transfer intermediate chambers MM1 and MM2. The process modules PM5 to PM8 are connected to two opposite side surfaces of the vacuum transfer module TM2. The transfer intermediate chambers MM1 and MM2 are connected to one of other two opposite side surfaces of the vacuum transfer module TM2. The side surfaces of the vacuum transfer module TM2 to which the transfer intermediate chambers MM1 and MM2 are connected are angled by the two transfer intermediate chambers MM1 and MM2. The vacuum transfer module TM1 and the vacuum transfer module TM2 are connected with the two transfer intermediate chambers MM1 and MM2 interposed therebetween. The vacuum transfer modules TM1 and TM2 have vacuum chambers, and transfer robots TR1 and TR2 are disposed therein, respectively. Further, image sensors IS are disposed in each of the vacuum transfer modules TM1 and TM2.

The transfer robots TR1 and TR2 are configured to be rotatable, extensible/contractible, and vertically movable. The transfer robot TR1 places an object to be transferred on a fork FK1 disposed at a tip end thereof, and transfers the object to be transferred between the load-lock modules LL1 and LL2, the transfer intermediate chambers MM1 and MM2, and the process modules PM1 to PM4. The transfer robot TR2 places an object to be transferred on a fork FK2 disposed at a tip end thereof, and transfers the object to be transferred between the transfer intermediate chambers MM1 and MM2 and the process modules PM5 to PM8. The object to be transferred includes a substrate and a consumable part. The substrate may be, e.g., a semiconductor wafer. The consumable part is replaceably attached to the process modules PM1 to PM8, and consumed by performing various processing such as plasma processing and the like in the process modules PM1 to PM8. The consumable part includes, e.g., an edge ring 113, a cover ring 114, and a ceiling plate 121 of an upper electrode 12, which will be described later. FIG. 1 shows a state in which the transfer robot TR1 places the edge ring 113 on the fork FK1 and the transfer robot TR2 places the edge ring 113 on the fork FK2.

Figure 2:
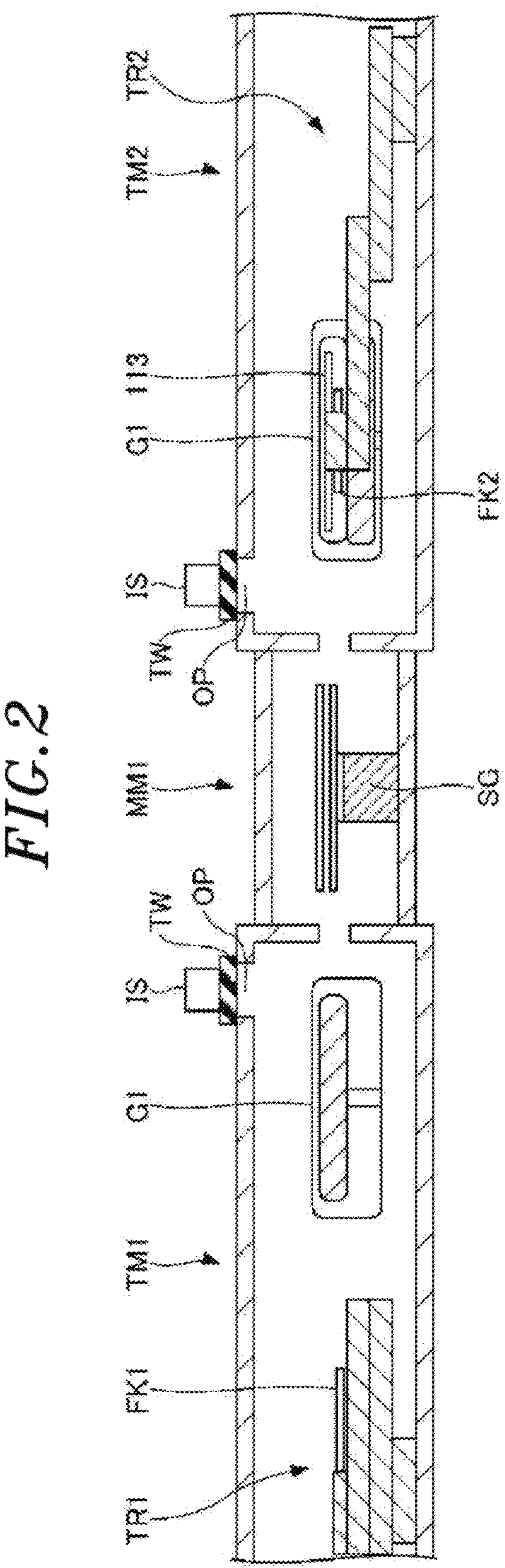
FIG. 2 is a schematic cross-sectional view showing an example of a connecting portion in the processing system of FIG. 1.

The image sensors IS capture images including the forks FK1 and FK2 of the transfer robots TR1 and TR2 and the object to be transferred held by the forks FK1 and FK2. The image sensors IS transmit the captured images to the controller CU. The image sensors IS are disposed on a transfer path of the object to be transferred. For example, the image sensors IS are disposed near the load-lock modules LL1 and LL2 of the vacuum transfer module TM1, near the transfer intermediate chambers MM1 and MM2 of the vacuum transfer module TM1, and near the transfer intermediate chambers MM1 and MM2 of the vacuum transfer module TM2 (FIG. 1). However, the positions and the number of the image sensors IS are not limited thereto. For example, one image sensor IS may be disposed in each of the vacuum transfer modules TM1 and TM2. The image sensors IS are disposed on the vacuum transfer modules TM1 and TM2, for example. Specifically, the image sensors IS are disposed on light transmitting windows TW airtightly attached to openings OP formed at a part of the ceiling portions of the vacuum transfer modules TM1 and TM2 via sealing members (not shown) (FIG. 2). The image sensors IS image the insides of the vacuum transfer modules TM1 and TM2 through the light transmitting windows TW, and capture images including the forks FK1 and FK2 of the transfer robots TR1 and TR2, and the objects to be transferred held by the forks FK1 and FK2. The image sensors IS may be, e.g., a CCD camera or a COMS camera.

Figure 9:
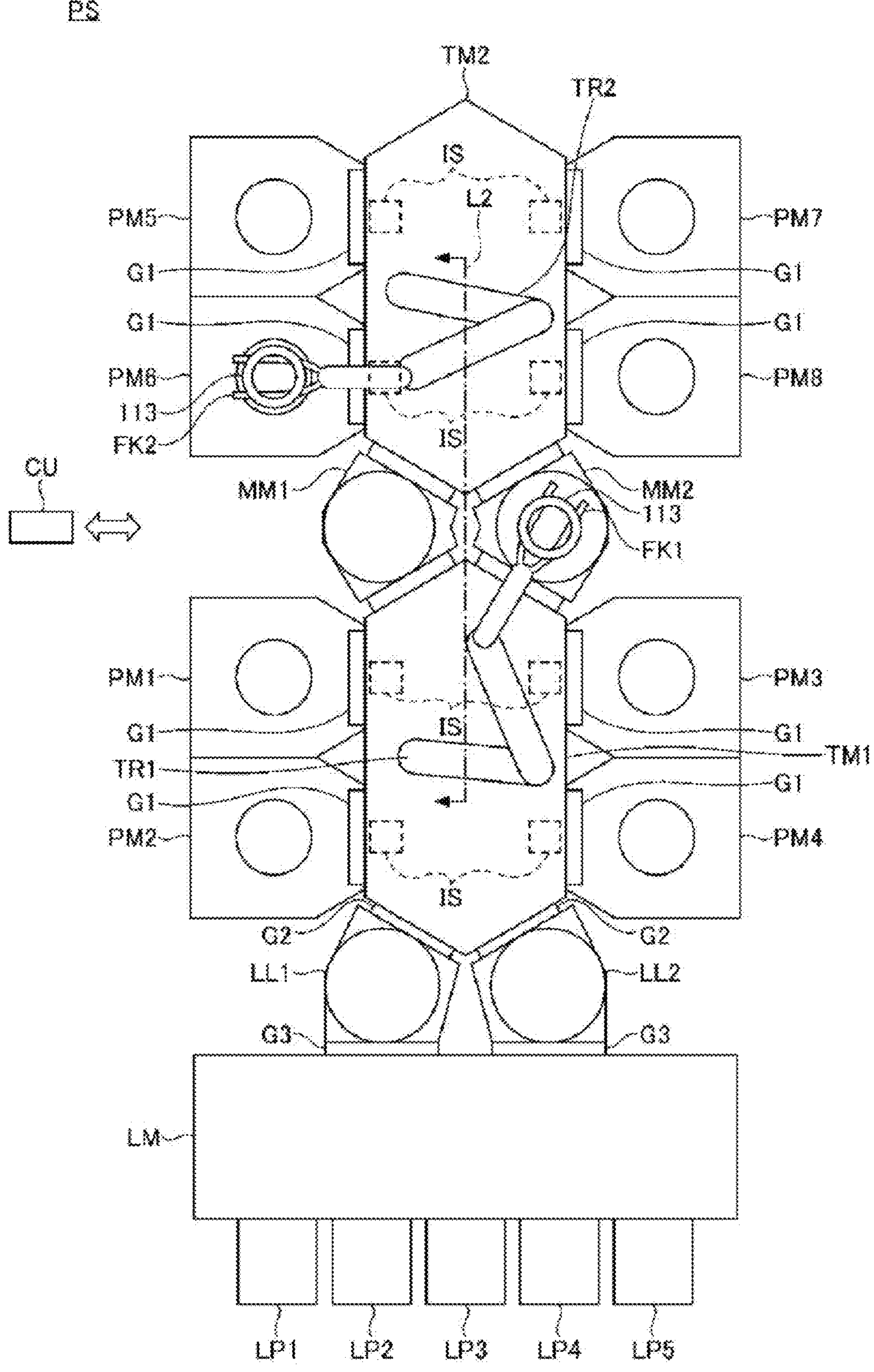
FIG. 9 showing another example of a position where an image sensor is disposed.

Further, as shown in FIG. 9, for example, the image sensors IS may be disposed near four gate valves G1 in the vacuum transfer module TM1 and near four gate valves G1 in the vacuum transfer module TM2. In this case, the image sensors IS can acquire images including the forks FK1 and FK2 and the object to be transferred in the case of transferring the object to be transferred, and acquire images in the process modules PM1 to PM8 in the case of performing various processes in the process modules PM1 to PM8. The states in the process modules PM1 to PM8 during various processes can be detected from the acquired images in the process modules PM1 to PM8. The gate valves G1 are closed when various processes are performed in the process modules PM1 to PM8. Therefore, the gate valves G1 are provided with, e.g., light transmitting windows such as a quartz window or the like so that the image sensors IS can acquire images in the process modules PM1 to PM8 through the gate valves G1. However, when the images in the process modules PM1 to PM8 are acquired in a state where the gate valves G1 are opened, the gate valves G1 may not be provided with the light transmitting windows. Further, it is preferable that the image sensors IS have variable imaging directions so that they can acquire a plurality of images including the images including the forks FK1 and FK2 and the object to be transferred and the images in the process modules PM1 to PM8. However, the imaging directions of the image sensors IS may be fixed when it is possible to capture a plurality of images including the images including the forks FK1 and FK2 and the object to be transferred and the images in the process modules PM1 to PM8 without changing the imaging directions.

Further, the image sensors IS may be movable. For example, the image sensors IS may be configured to be movable in a horizontal direction along the horizontal movement of the forks FK1 and FK2. Accordingly, one image sensor IS can acquire images at a plurality of positions, so that the number of the image sensors IS can be reduced.

Figure 10:
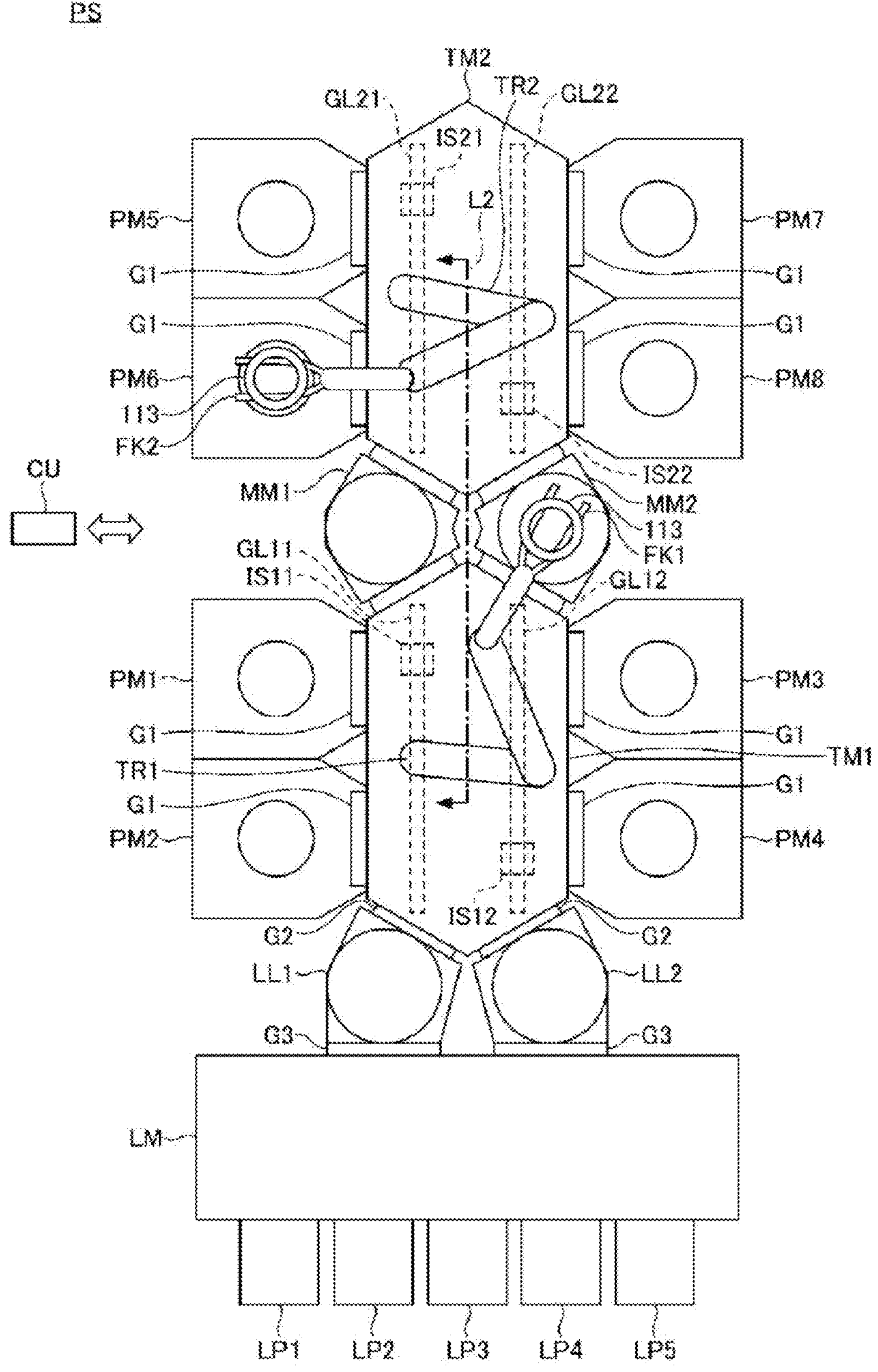
FIG. 10 shows still another example of the position where the image sensor is disposed.

In the example of FIG. 10, the vacuum transfer module TM1 is provided with guide rails GL11 and GL12 and image sensors IS11 and IS12, and the vacuum transfer module TM2 is provided with guide rails GL21 and GL22 and image sensors IS21 and IS22. Hereinafter, the guide rails GL11 and GL12 and the image sensors IS11 and IS12 will be described. The guide rails GL21 and GL22 may have the same configuration, and the image sensors IS21 and IS22 may have the same configuration.

The guide rail GL11 is disposed on a ceiling portion of the vacuum transfer module TM1 along a longitudinal direction of the vacuum transfer module TM1. One end of the guide rail GL11 is located near the transfer intermediate chamber MM1 of the vacuum transfer module TM1, and the other end thereof is located near a gate valve G2 of the vacuum transfer module TM1. The image sensor IS11 is movably attached to the guide rail GL11 and moves along the guide rail GL11 in the longitudinal direction of the vacuum transfer module TM1. A light transmitting window (not shown) is formed at the ceiling portion of the vacuum transfer module TM1 to correspond to a moving range of the image sensor IS11. The image sensor IS11 moves to one end of the guide rail GL11 and acquires images including an object to be transferred between the vacuum transfer module TM1 and the transfer intermediate chamber MM1 and the fork FK1 holding the object to be transferred through the light transmitting window. On the other hand, the image sensor IS11 moves to the other end of the guide rail GL 11 and acquires images including an object to be transferred between the vacuum transfer module TM1 and the load-lock module LLM1 and the fork FK1 holding the object to be transferred through the light transmitting window.

The guide rail GL12 is disposed on a ceiling portion of the vacuum transfer module TM1 along the longitudinal direction of the vacuum transfer module TM1. One end of the guide rail GL12 is located near the transfer intermediate chamber MM2 of the vacuum transfer module TM1, and the other end thereof is located near the gate valve G2 of the vacuum transfer module TM1. The image sensor IS12 is movably attached to the guide rail GL12, and moves along the guide rail GL12 in the longitudinal direction of the vacuum transfer module TM1. A light transmitting window (not shown) is formed at the ceiling portion of the vacuum transfer module TM1 to correspond to a moving range of the image sensor IS12. The image sensor IS12 moves to one end of the guide rail GL12 and acquires images including an object to be transferred between the vacuum transfer module TM1 and the transfer intermediate chamber MM2 and the fork FK1 holding the object to be transferred through the light transmitting window. On the other hand, the image sensor IS12 moves to the other end of the guide rail GL 12 and acquires images including an object to be transferred between the vacuum transfer module TM1 and the load-lock module LL2 and the fork FK1 holding the object to be transferred through the light transmitting window.

The controller CU moves the image sensors IS11 and IS12 along the horizontal movement of the fork FK1 based on position information of the fork FK1, for example.

In the example of FIG. 10, the case in which the vacuum transfer module TM1 is provided with the guide rails GL11 and GL12 and the image sensors IS11 and IS12 has been described. However, the present disclosure is not limited thereto. For example, the vacuum transfer module TM1 may be provided with a guide rail extending in a longitudinal direction and a lateral direction of the vacuum transfer module TM1, and one or more image sensors may be disposed on the guide rail.

Further, in the example of FIG. 10, the case in which the guide rails GL11 and GL12 and the image sensors IS11 and IS12 are disposed on the ceiling portion of the vacuum transfer module TM1 has been described. However, the present disclosure is not limited thereto. For example, the guide rails GL11, GL12 and the image sensors IS11, IS12 may be disposed in the vacuum transfer module TM1.

The transfer intermediate chambers MM1 and MM2 are disposed between the vacuum transfer module TM1 and the vacuum transfer module TM2. The insides of the transfer intermediate chambers MM1 and MM2 communicate with the insides of the vacuum transfer modules TM1, TM2, respectively, and are maintained in a vacuum atmosphere. A stage SG is disposed in each of the transfer intermediate chambers MM1 and MM2. The stage SG temporarily places an object to be transferred on an upper surface thereof. The transfer intermediate chambers MM1 and MM2 function as buffers for transferring a substrate and a consumable part between the vacuum transfer module TM1 and the vacuum transfer module TM2. For example, the transfer robot TR1 places a consumable part on the stage SG in the transfer intermediate chamber MM1 and the transfer robot TR2 receives the consumable part placed on the stage SG, so that the consumable part is transferred from the vacuum transfer module TM1 to the vacuum transfer module TM2. Further, for example, the transfer robot TR2 places the consumable part on the stage SG in the transfer intermediate chamber MM1 and the transfer robot TR1 receives the consumable part placed on the stage SG, so that the consumable part is transferred from the vacuum transfer module TM2 to the vacuum transfer module TM1. The transfer intermediate chamber MM2 may be used instead of the transfer intermediate chamber MM1. The substrate may be delivered between the vacuum transfer module TM1 and the vacuum transfer module TM2 in the same manner as that for the consumable part.

The process modules PM1 to PM8 have processing chambers, and stages are disposed therein. After substrates are placed on the stages, the process modules PM1 to PM8 are depressurized to introduce a processing gas. Then, an RF power is applied to generate plasma, and the substrate is subjected to plasma processing using the plasma. The vacuum transfer modules TM1 and TM2 and the process modules PM1 to PM8 are separated by the gate valves G1 that can be opened and closed. The edge ring 113, the cover ring 114, and the like are disposed on the stage. The upper electrode 12 for applying an RF power is disposed above the stage to face the stage.

The load-lock modules LL1 and LL2 are disposed between the vacuum transfer module TM1 and the atmospheric transfer module LM. Each of the load-lock modules LL1 and LL2 has a chamber of which inner pressure can be switched between a vacuum state and an atmospheric pressure. A stage is disposed in each of the load-lock modules LL1 and LL2. In the case of loading the substrates from the atmospheric transfer module LM to the vacuum transfer module TM1, the substrates are transferred from the atmospheric transfer module LM into the load-lock modules LL1 and LL2 maintained at an atmospheric pressure; the pressures in the load-lock modules LL1 and LL2 are switched to a vacuum state; and the substrates are loaded into the vacuum transfer module TM1. In the case of unloading the substrates from the vacuum transfer module TM1 to the atmosphere transfer module LM, the substrates are transferred from the vacuum transfer module TM1 into the load-lock modules LL1 and LL2 maintained in a vacuum state; the pressures in the load-lock modules LL1 and LL2 are increased to an atmospheric pressure; and the substrates are loaded into the atmospheric transfer module LM. The load-lock modules LL1 and LL2 and the vacuum transfer module TM1 are separated by the gate valves G2 that can be opened and closed. The load-lock modules LL1 and LL2 and the atmospheric transfer module LM are separated by gate valves G3 that can be opened and closed.

The atmospheric transfer module LM is disposed to be opposite to the vacuum transfer module TM1. The atmospheric transfer module LM may be, e.g., an equipment front end module (EFEM). The atmospheric transfer module LM is a rectangular parallelepiped-shaped atmospheric transfer chamber having a fan filter unit (FFU) and maintained at an atmospheric pressure. The two load-lock modules LL1 and LL2 are connected to one long side of the atmospheric transfer module LM. Load ports LP1 to LP5 are connected to the other long side of the atmospheric transfer module LM. A container (not shown) accommodating objects to be transferred is placed on each of the load ports LP1 to LP5. The container includes, e.g., a container containing one or more substrates, and a container containing one or more consumable parts. The container accommodating substrates may be, e.g., a front opening unified pod (FOUP). The container accommodating the consumable parts includes, e.g., a container accommodating the edge ring 113, a container accommodating the cover ring 114, and a container accommodating the ceiling plate 121 of the upper electrode 12. A transfer robot (not shown) is disposed in the atmospheric transfer module LM. The transfer robot transfers an object to be transferred between the container placed on the load ports LP1 to LP5 and the chambers of the load-lock modules LL1 and LL2 of which inner pressures are variable.

The controller CU controls individual components of the processing system, such as the transfer robots TR1 and TR2 respectively disposed in the vacuum transfer modules TM1 and TM2, the transfer robot disposed in the atmospheric transfer module LM, and the gate valves G1 to G4. Further, the controller CU controls the individual components of the processing system PS to execute the transfer method according to an embodiment to be described later. The controller CU includes a central processing unit (CPU), a random access memory (RAM), a read only memory (ROM), an auxiliary storage device, and the like. The CPU operates based on a program stored in the ROM or the auxiliary storage device. The CPU controls the individual components of the processing system PS.

Plasma Processing Apparatus

Figure 3:
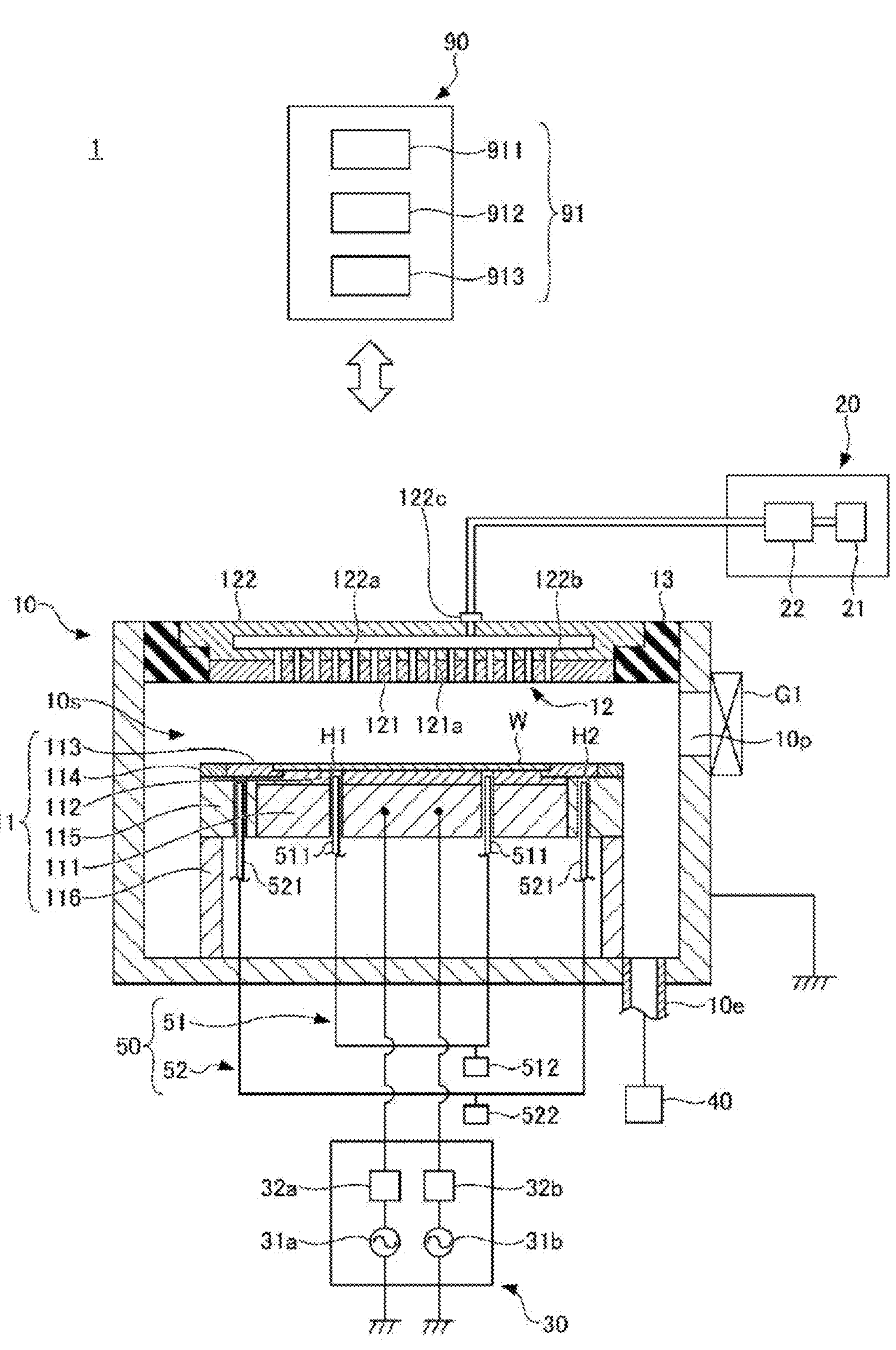
FIG. 3 is a schematic cross-sectional view showing an example of a process module in the processing system of FIG. 1.

An example of the plasma processing apparatus used as the process modules PM1 to PM8 of the processing system PS of FIG. 1 will be described with reference to FIG. 3.

The plasma processing apparatus 1 includes a chamber 10, a gas supplier 20, an RF power supplier 30, an exhaust 40, an elevating mechanism 50, and a controller 90.

The chamber 10 includes a support 11 and an upper electrode 12. The support 11 is disposed in a lower region of a processing space 10*s* in the chamber 10. The upper electrode 12 is disposed above the support 11, and may function as a part of a ceiling plate of the chamber 10.

The support 11 supports the substrate W in the processing space 10*s*. The support 11 includes a lower electrode 111, an electrostatic chuck 112, an edge ring 113, a cover ring 114, an insulator 115, and a base 116. The electrostatic chuck 112 is disposed on the lower electrode 111. The electrostatic chuck 112 supports the substrate W on an upper surface thereof. The edge ring 113 is an annular member disposed around the substrate W. The edge ring 113 protects an end portion of the electrostatic chuck 112 from plasma. Further, the edge ring 113 reduces non-uniformity of etching characteristics of an outer peripheral portion of the substrate W and improves in-plane uniformity of the etching characteristics. The cover ring 114 is an annular member disposed around the edge ring 113. The cover ring 114 protects an upper surface of the insulator 115 from plasma. The insulator 115 is disposed on the base 116 to surround the lower electrode 111. The base 116 is fixed to the bottom portion of the chamber 10 and supports the lower electrode 111 and the insulator 115.

The upper electrode 12 constitutes the chamber 10 together with the insulating member 13. The upper electrode 12 supplies one or more processing gases from the gas supplier 20 to the processing space 10*s*. The upper electrode 12 includes a ceiling plate 121 and a support body 122. A bottom surface of the ceiling plate 121 defines the processing space 10*s*. A plurality of gas injection holes 121*a* is formed in the ceiling plate 121. The gas injection holes 121*a* penetrates through the ceiling plate 121 in a plate thickness direction (vertical direction). The support body 122 detachably supports the ceiling plate 121. A gas diffusion space 122*a* is formed in the support 122. A plurality of gas holes 122*b* extends downward from the gas diffusion space 122*a*. The gas holes 122*b* communicate with the gas injection holes 121*a*, respectively. A gas inlet 122*c* is formed at the support body 122. The upper electrode 12 supplies one or more processing gases from the gas inlet port 122*c* to the processing space 10*s* through the gas diffusion space 122*a*, the gas holes 122*b*, and the gas injection holes 121*a*.

The gas supplier 20 includes one or more gas sources 21 and one or more flow rate controller 22. The gas supplier 20 supplies one or more processing gases from the gas sources 21 to the gas inlet port 122*c* through the flow rate controllers 22. The flow rate controllers 22 may include, e.g., a mass flow controller or a pressure-controlled flow rate controller. Further, the gas supplier 20 may include one or more flow rate modulation devices for modulating the flow rates of one or more processing gases or causing them to pulsate.

The RF power supplier 30 includes two RF power supplies (first RF power supply 31*a* and second RF power supply 31*b*) and two matching units (first matching unit 32*a* and second matching unit 32*b*). The first RF power supply 31*a* supplies a first RF power to the lower electrode 111 through the first matching unit 32*a*. The frequency of the first RF power may be within a range of, e.g., 3 Hz to 3000 GHz. The second RF power supply 31*b* supplies a second RF power to the lower electrode 111 through the second matching unit 32*b*. The frequency of the second RF power may be within a range of, e.g., 400 kHz to 13.56 MHz. A DC power supply may be used, instead of the second RF power supply 31*b*.

The exhaust system 40 is connected to an exhaust port 10*e* disposed at a bottom portion of the chamber 10. The exhaust system 40 includes a pressure valve, a vacuum pump, or the like.

A loading/unloading port 10*p* is formed on a sidewall of the chamber 10. The substrate W is transferred between the processing space 10*s* and the outside of the chamber 10 through the loading/unloading port 10*p*. The loading/unloading port 10*p* is opened and closed by the gate valve G1.

The elevating mechanism 50 includes a first elevating mechanism 51 and a second elevating mechanism 52.

The first elevating mechanism 51 includes a plurality of support pins 511 and a motor 512. The support pins 511 are inserted into through holes H1 formed in the lower electrode 111 and the electrostatic chuck 112 to protrude and retract with respect to the upper surface of the electrostatic chuck 112. When the support pins 511 protrude from the upper surface of the electrostatic chuck 112, upper ends of the support pins 511 are in contact with a bottom surface of the substrate W to support the substrate W. The motor 512 raises and lowers the support pins 511. The motor 512 may be a motor such as a DC motor, a stepping motor, or a linear motor, a piezo actuator, an air driving mechanism, or the like. The first elevating mechanism 51 raises and lowers the support pins 511 to transfer the substrate W between the transfer robots TR1 and TR2 and the support 11, for example.

The second elevating mechanism 52 includes a plurality of support pins 521 and a motor 522. The support pins 521 are inserted into through holes H2 formed in the insulator 115 to protrude and retract with respect to the upper surface of the insulator 115. When the support pins 521 protrude from the upper surface of the insulator 115, upper ends of the support pins 521 are in contact with a bottom surface of the edge ring 113 to support the edge ring 113. The motor 522 raises and lowers the support pins 521. The motor 522 may be a motor such as a DC motor, a stepping motor, or a linear motor, a piezo actuator, an air driving mechanism, or the like. The second elevating mechanism 52 raises and lowers the support pins 521 to transfer the edge ring 113 between the transfer robots TR1 and TR2 and the support 11, for example.

Although not shown, the support 11 is provided with an elevating mechanism for raising and lowering the cover ring 114. The elevating mechanism includes a plurality of support pins disposed at positions where they can be in contact with a bottom surface of the cover ring 114, and a motor for raising and lowering the support pins.

The controller 90 controls the individual components of the plasma processing apparatus 1. The controller 90 includes, e.g., a computer 91. The computer 91 includes, e.g., a CPU 911, a storage unit 912, a communication interface 913, and the like. The CPU 911 may be configured to perform various control operations based on the program stored in the storage unit 912. The storage unit 912 includes at least one memory selected from a group consisting of an auxiliary storage device such as a RAM, a ROM, a hard disk drive (HDD), a solid state drive (SSD), or the like. The communication interface 913 may communicate with the plasma processing apparatus 1 through a communication line such as a local area network (LAN) or the like.

Transfer Method

Figure 4:
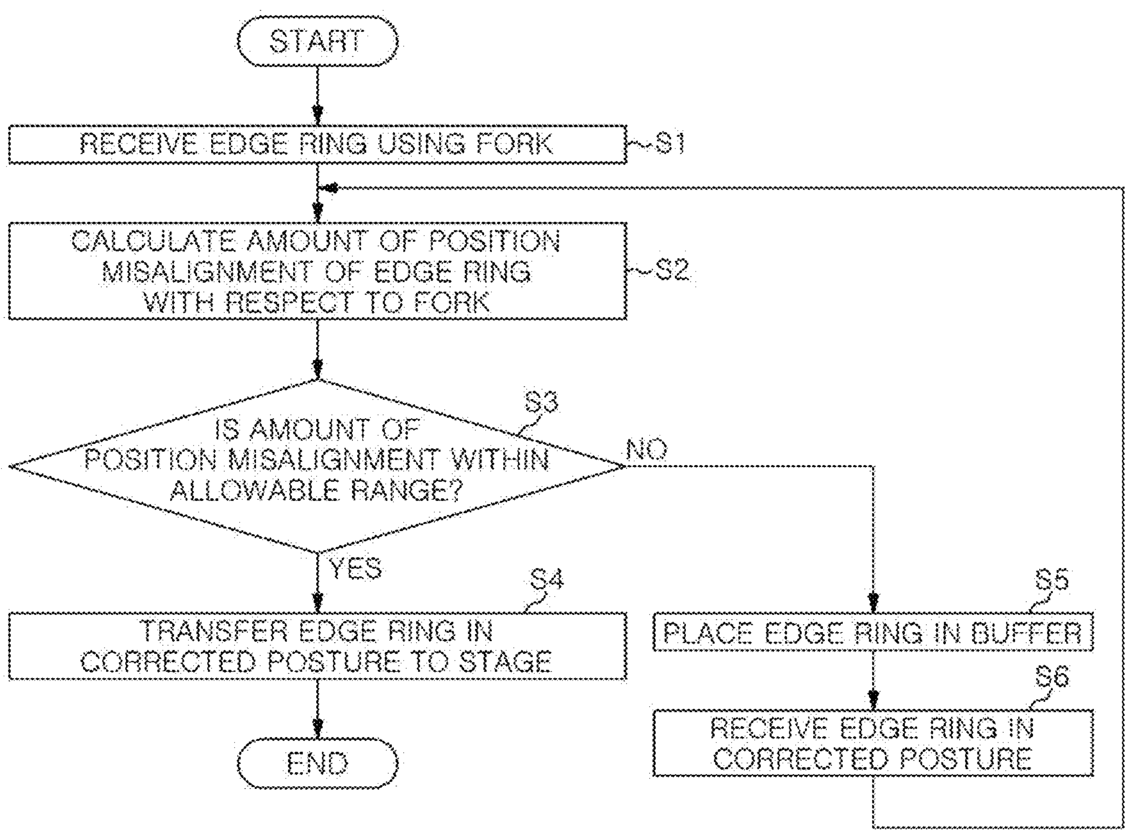
FIG. 4 shows an example of a transfer method according to an embodiment.

An example of a transfer method according to an embodiment will be described with reference to FIG. 4. Hereinafter, a case in which the edge ring 113 is transferred to the process module PM1 and placed on an empty stage in the process module PM1 of the processing system PS shown in FIG. 1 will be described as an example.

In step S1, first, the controller CU unloads the edge ring 113 in the container placed on, e.g., the load port LP1 using a transfer robot (not shown) in the atmospheric transfer module LM. Then, the controller CU opens the gate valve G3 between the atmospheric transfer module LM and the load-lock module LL1. Then, the controller CU places the edge ring 113 on the stage in the load-lock module LL1 using the transfer robot. Then, the controller CU closes the gate valve G3 and reduces a pressure in the load-lock module LL1 to a vacuum level. Then, the controller CU opens the gate valve G2 between the load-lock module LL1 and the vacuum transfer module TM1. Then, the controller CU receives the edge ring 113 placed on the stage in the load-lock module LL1 using the fork FK1 of the transfer robot TR1 in the vacuum transfer module TM1.

Figure 5:
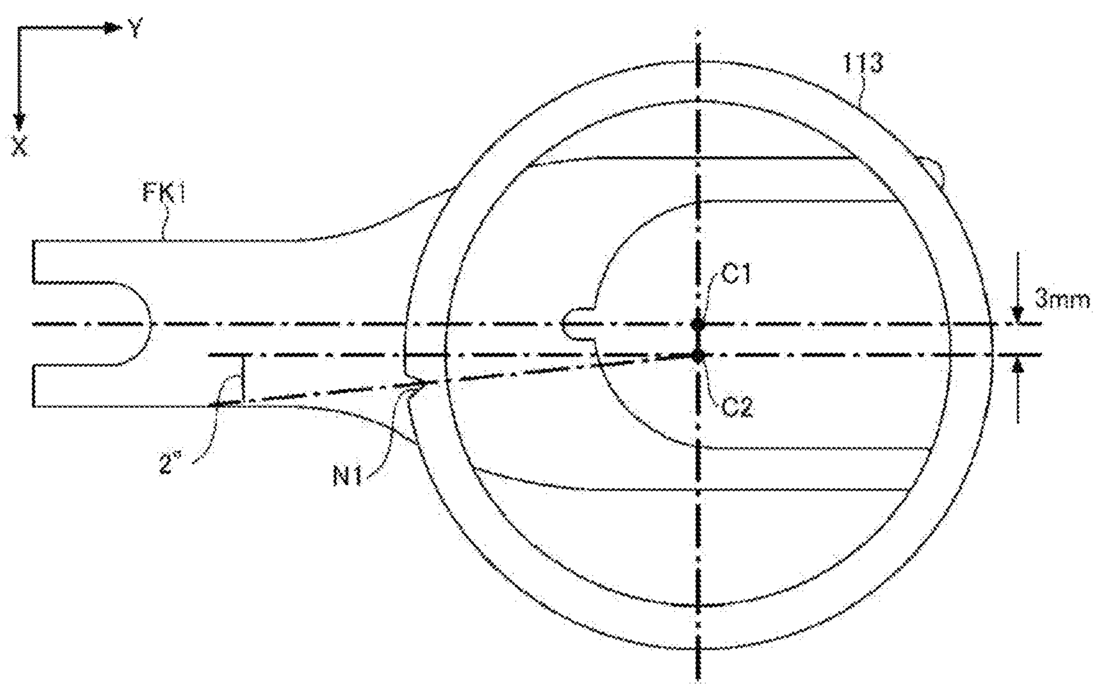
FIGS. 5 to 7 explain a positional relationship between a fork and an edge ring.

In step S2, first, the controller CU controls the transfer robot TR1 and moves the fork FK1 on which the edge ring 113 is placed to an imaging region of one image sensor IS in the vacuum transfer module TM1. Then, the controller CU controls the image sensor IS and acquires images including the fork FK1 and the edge ring 113 placed on the fork FK1. Then, the controller CU calculates an amount of position misalignment including misalignment in a horizontal direction and a rotational direction of the edge ring 113 with respect to the fork FK1 based on the images acquired by the image sensor IS. In the present embodiment, as shown in FIG. 5, a center position C2 of the edge ring 113 is misaligned by 3 mm to the right side (+X direction) with respect to a center position C1 of the fork FK1. Further, a notch position N1 of the edge ring 113 is rotated by 2° in a counterclockwise direction with respect to a retreating direction (−Y direction) of the fork FK1. Therefore, the amount of the position misalignment of the edge ring 113 in the left-right direction calculated by the controller CU is +3 mm and the amount of the position misalignment of the edge ring 113 in the rotational direction calculated by the controller CU is +2°.

In step S3, the controller CU determines whether or not the amount of the position misalignment calculated in step S2 is within an allowable range. The allowable range is determined depending on the specifications of the processing system PS, for example. If it is determined in step S3 that the amount of the position misalignment is within the allowable range, the controller CU proceeds the processing to step S4. On the other hand, if it is determined in step S3 that the amount of the position misalignment is out of the allowable range, the processing proceeds to step S5 by the controller CU.

Figure 6:
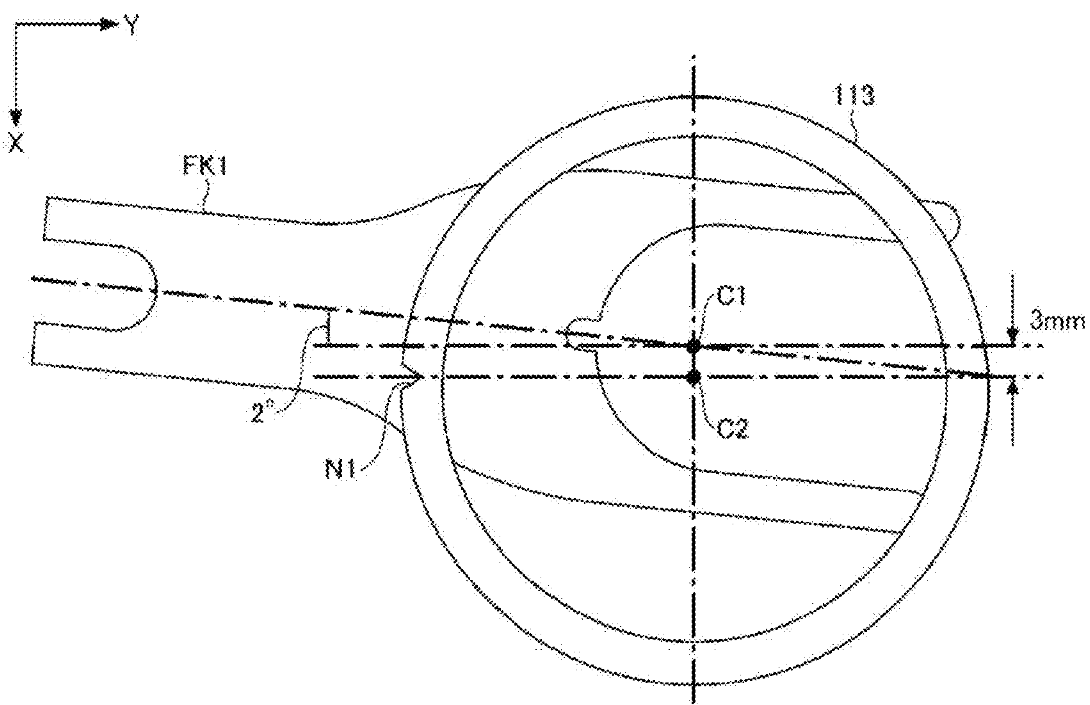

In step S4, first, the controller CU opens the gate valve G1 between the vacuum transfer module TM1 and the process module PM1. Then, the controller CU controls the transfer robot TR1, transfers the edge ring 113 in a posture corrected based on the amount of the position misalignment calculated in step S2 into the process module PM1, and places the edge ring 113 on the stage. In the present embodiment, as shown in FIG. 6, the controller CU controls the transfer robot TR1 and places the edge ring 113 in a first posture on the stage in the process module PM1. At the first posture, the fork FK1 is shifted by 3 mm to the left side (−X direction) from the reference position and is shifted by 2° in a clockwise direction with the center position C1 of the fork FK1 as the center of rotation. After step S4, the controller CU ends the processing.

In step S5, the controller CU controls the transfer robot TR1 to transfer the edge ring 113 to the transfer intermediate chamber MM1 as a buffer and place the edge ring 113 on the stage SG in the transfer intermediate chamber MM1. The controller CU may transfer the edge ring 113 to the transfer intermediate chamber MM2, for example, instead of the transfer intermediate chamber MM1.

Figure 7:
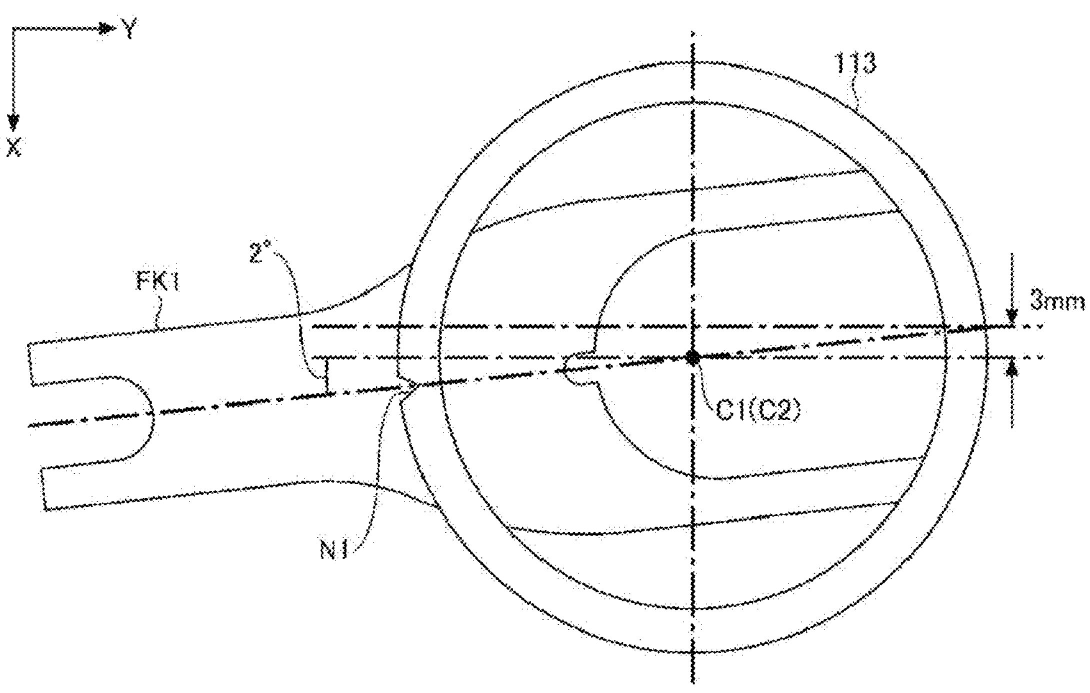

In step S6, the controller CU controls the transfer robot TR1 to receive the edge ring 113 placed on the stage SG in the transfer intermediate chamber MM1 while maintaining the posture corrected based on the amount of the position misalignment calculated in step S2. In the present embodiment, as shown in FIG. 7, the controller CU controls the transfer robot TR1 to receive the edge ring 113 placed on the stage SG in the transfer intermediate chamber MM1 while maintaining a second posture. At the second posture, the fork FK1 is shifted by 3 mm to the right side (+X direction) from the reference position and is shifted by 2° in the counterclockwise direction with the center position C1 of the fork FK1 as the center of rotation. After step S6, the controller CU returns the processing to step S2.

In accordance with the transfer method of the above-described embodiment, the image sensor IS captures the images including the fork FK1 and the edge ring 113 placed on the fork FK1, and the controller CU calculates the amount of the position misalignment including misalignment in the horizontal direction and the rotational direction of the edge ring 113 based on the captured images. Accordingly, the positioning of the edge ring 113 can be performed without a positioning device such as an aligner or the like. Hence, the footprint of the processing system PS can be reduced.

Further, in accordance with the transfer method of the above-described embodiment, the controller CU controls the transfer robot TR1 to place the edge ring 113 in the posture corrected based on the calculated amount of the position misalignment on the stage in the process module PM1. Accordingly, the edge ring 113 can be automatically replaced with high accuracy without opening the process module PM1 to the atmosphere.

Further, in accordance with the transfer method of the above-described embodiment, when it is determined that the amount of the position misalignment calculated based on the image is out of the allowable range, the controller CU controls the transfer robot TR1 to temporarily place the edge ring 113 on the stage SG in the transfer intermediate chamber MM1. Then, the controller CU controls the transfer robot TR1 to receive the edge ring 113 placed on the stage SG in the transfer intermediate chamber MM1 while maintaining the posture corrected based on the amount of the position misalignment calculated based on the image. Accordingly, the position of the edge ring 113 can be corrected even when the amount of the position misalignment of the edge ring 113 with respect to the fork FK1 is large. Hence, even when the amount of the position misalignment of the edge ring 113 with respect to the fork FK1 is large, the edge ring 113 can be automatically replaced with high accuracy without opening the process module PM1 to the atmosphere.

Figure 8:
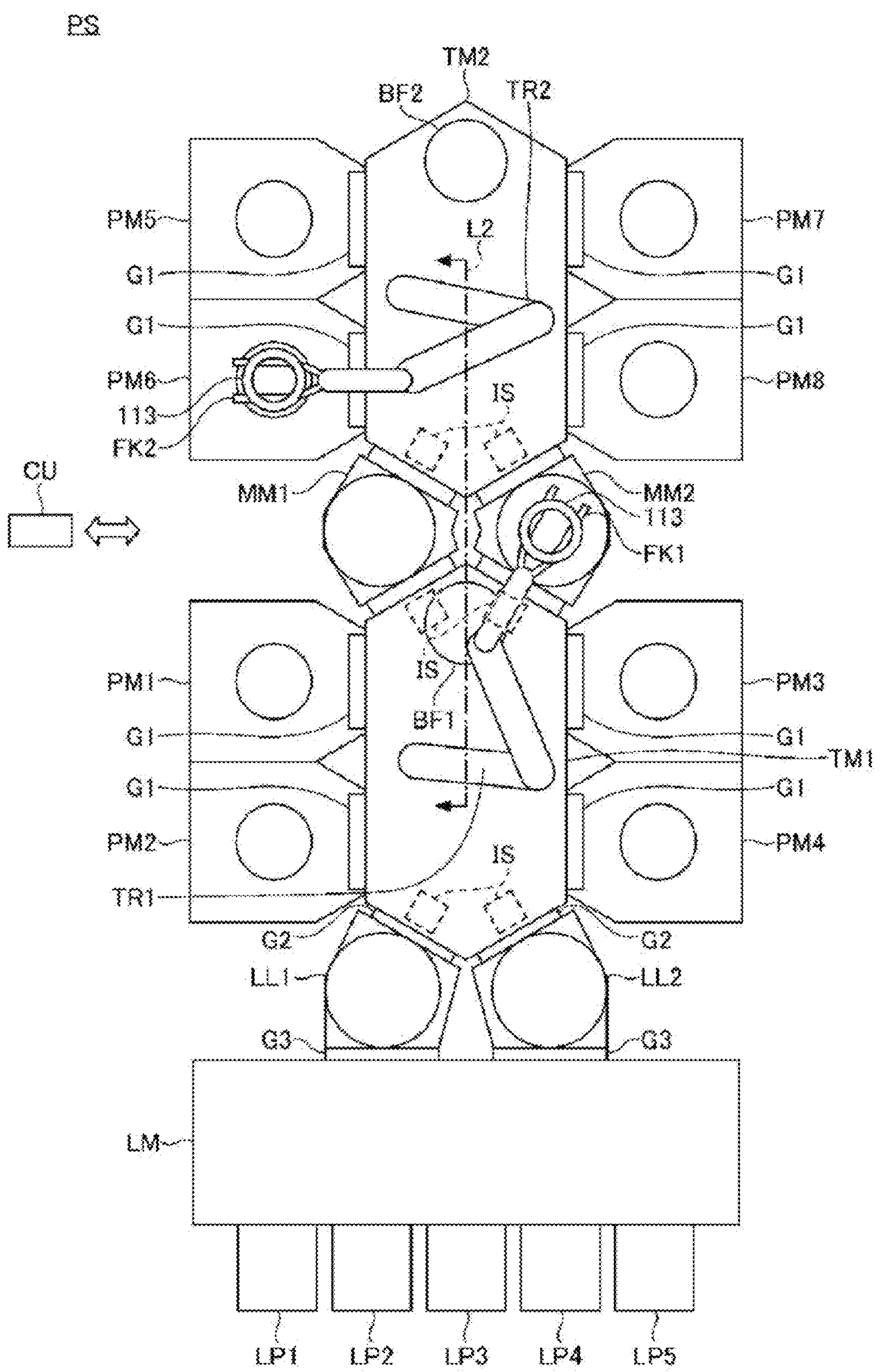
FIG. 8 is a schematic cross-sectional view showing another example of the process module in the processing system of FIG. 1.

In the above-described embodiment, in steps S5 to S6, the case in which the transfer intermediate chambers MM1 and MM2 are used as buffers for temporarily placing the edge ring 113 has been described. However, the present disclosure is not limited thereto. For example, as shown in FIG. 8, a support portion BF1 on which the edge ring 113 can be placed is disposed in the vacuum transfer module TM1, and the support portion BF1 may be used a buffer on which the edge ring 113 is temporarily placed.

Further, for example, the transfer method of the above-described embodiment can also be applied to the case of transferring the edge ring 113 to other process modules PM2 to PM4 connected to the vacuum transfer module TM1 to which the process module PM1 is connected.

Further, for example, the transfer method of the above-described embodiment can also be applied to the case of transferring the edge ring 113 to the process modules PM5 to PM8 connected to the vacuum transfer module TM2 different from the vacuum transfer module to which the process module PM1 is connected. In this case, the transfer robot TR1 that has received the edge ring 113 placed on the stage in the load-lock module LL1 places the edge ring 113 on the stage SG in the transfer intermediate chamber MM1 or MM2. Then, the transfer robot TR2 receives the edge ring 113 placed on the stage SG in the transfer intermediate chamber MM1 or MM2. Then, the image sensors IS in the vacuum transfer module TM2 capture images including the fork FK2 of the transfer robot TR2 and the edge ring 113 placed on the fork FK2. Then, the controller CU calculates the amount of the position misalignment including misalignment in the horizontal direction and the rotational direction of the edge ring 113 based on the images, transfers the edge ring 113 in the posture corrected based on the calculated amount of the position misalignment into the process module PM5 to PM5, and places the edge ring 113 on the stage. In this case as well, as shown in FIG. 8, for example, a support portion BF2 on which the edge ring 113 can be placed is disposed in the vacuum transfer module TM2, and the support portion BF2 may be used as a buffer on which the edge ring 113 is temporarily placed.

Further, in the transfer method of the above-described embodiment, the case in which the edge ring 113 is transferred into the process module PM1 and placed on an empty stage in the process module PM1 has been described. However, the present disclosure is not limited thereto.

For example, the transfer method of the above-described embodiment can also be applied to the case of replacing a used edge ring 113 placed on the stage in the process module PM1 with a new edge ring 113. In this case, the controller CU controls the individual components of the processing system PS to unload the used edge ring 113 placed on the stage in the process module PM1 and replace the edge ring 113 by performing the transfer method of the above-described embodiment. The used edge ring 113 is unloaded as follows, for example.

First, the controller CU opens the gate valves G1 between the vacuum transfer module TM1 and the process module PM1 and the gate valves G2 between the load-lock module LL1 and the vacuum transfer module TM1. Next, the controller CU controls the transfer robot TR1 to receive the used edge ring 113 placed on the stage in the process module PM1 and place the edge ring 113 on the stage in the load-lock module LL1. Next, the controller CU closes the gate valves G1 between the vacuum transfer module TM1 and the process module PM1 and the gate valves G2 between the load-lock module LL1 and the vacuum transfer module TM1. Then, the controller CU switches the inner atmosphere of the load-lock module LL1 from a vacuum state to an atmospheric pressure. Then, the controller CU opens the gate valve G3 between the atmospheric transfer module LM and the load-lock module LL1. Then, the controller CU receives the used edge ring 113 placed on the stage in the load-lock module LL1 using the transfer robot in the atmospheric transfer module LM. Then, the controller CU accommodates the edge ring 113 in a container placed on, e.g., the load port LP1 using the transfer robot.

For example, the transfer method of the above-described embodiment can also be applied to the case of transferring a substrate or another consumable part such as the cover ring 114, the ceiling plate 121 of the upper electrode 12, or the like.

In the above-described embodiment, the transfer robots TR1 and TR2 are examples of the transfer mechanism.

As described above, the embodiments of the present disclosure are illustrative in all respects and are not restrictive. The above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A detection device for detecting position misalignment of an object to be transferred with respect to a transferer, comprising:

an image sensor configured to capture images including the transferer and the object to be transferred which is held by the transferer, wherein the object to be transferred includes a consumable part used when plasma processing is performed on a substrate and the consumable part is an annular structure disposed around the substrate during the plasma processing;

a calculator configured to calculate an amount of position misalignment including misalignment in a horizontal direction and a rotational direction of the object to be transferred based on the images captured by the image sensor;

a buffer that includes a stage on which the object to be transferred is temporarily placed, and a posture of the object to be transferred is corrected in the buffer based on the amount of the position misalignment calculated by the calculator; and a first transfer module having a first transfer robot and a second transfer module having a second transfer robot, and the buffer is located in between the first transfer module and the second transfer module and communicates with both the first transfer module and the second transfer module, wherein the transferer accommodates in the buffer the object to be transferred whose images have been acquired by the image sensor, and receives from the buffer the object to be transferred in the corrected posture, and wherein the image sensor is located at least within the first transfer module.

2. The detection device of claim 1, wherein when the amount of the position misalignment calculated by the calculator is within an allowable range, the transferer transfers into a chamber the object to be transferred in the posture corrected based on the amount of position misalignment, and when the amount of the position misalignment calculated by the calculator is out of the allowable range, the transferer accommodates in the buffer the object to be transferred whose images have been acquired by the image sensor and receives from the buffer the object to be transferred in the posture corrected based on the amount of the position misalignment calculated by the calculator.

3. The detection device of claim 1, wherein the annular structure is an edge ring or a cover ring.

4. The detection device of claim 1, wherein the image sensor is movable in a horizontal direction within the first transfer module.

5. A processing system comprising:

a chamber to which an object to be transferred is transferred;

a transferer configured to transfer to the chamber the object to be transferred;

an image sensor configured to capture images including the transferer and the object to be transferred which is held by the transferer, wherein the object to be transferred includes a consumable part used when plasma processing is performed on a substrate and the consumable part is an annular structure disposed around the substrate during the plasma processing;

a calculator configured to calculate an amount of position misalignment including misalignment in a horizontal direction and a rotational direction of the object to be transferred based on the images captured by the image sensor;

a buffer that includes a stage on which the object to be transferred is temporarily placed, and a posture of the object to be transferred is corrected in the buffer based on the amount of the position misalignment calculated by the calculator; and a first transfer module that is connected to a load-lock module and having a first transfer robot and a second transfer module having a second transfer robot, and the buffer is located in between the first transfer module and the second transfer module and communicates with both the first transfer module and the second transfer module, wherein the first transfer robot receives the object to be transferred from the buffer in the corrected posture and transfers the object to a process module connected to the first transfer module, wherein the transferer accommodates in the buffer the object to be transferred whose images have been acquired by the image sensor, and receives from the buffer the object to be transferred in the corrected posture, and wherein the image sensor is located at least within the first transfer module.

6. The processing system of claim 5, wherein the image sensor is installed on a transfer path of the object to be transferred.

7. The processing system of claim 6, wherein the transferer transfers into the chamber the object to be transferred in a posture corrected based on the amount of the position misalignment calculated by the calculator.

8. The processing system of claim 5, wherein the transferer transfers into the chamber the object to be transferred in a posture corrected based on the amount of the position misalignment calculated by the calculator.

9. The processing system of claim 5, wherein the annular structure is an edge ring or a cover ring.

10. The processing system of claim 5, wherein the image sensor is movable in a horizontal direction within the first transfer module.

11. A processing system comprising:

a chamber to which an object to be transferred is transferred;

a transferer configured to transfer to the chamber the object to be transferred;

an image sensor configured to capture images including the transferer and the object to be transferred which is held by the transferer, wherein the object to be transferred includes a consumable part used when plasma processing is performed on a substrate and the consumable part is an annular structure disposed around the substrate during the plasma processing;

a calculator configured to calculate an amount of position misalignment including misalignment in a horizontal direction and a rotational direction of the object to be transferred based on the images captured by the image sensor; and a buffer that includes a stage on which the object to be transferred is temporarily placed, and a posture of the object to be transferred is corrected in the buffer based on the amount of the position misalignment calculated by the calculator; and a first transfer module that is connected to a load-lock module and having a first transfer robot and a second transfer module having a second transfer robot, and the buffer is located in between the first transfer module and the second transfer module and communicates with both the first transfer module and the second transfer module, wherein the image sensor is located in at least the second transfer module, wherein the first transfer robot in the first transfer module connected to the load-lock module places the object to be transferred on the stage of the buffer, the second transfer robot receives the object to be transferred from the stage of the buffer, and the image sensor disposed in the at least the second transfer module acquires an image including a fork of the second transfer robot and the object to be transferred placed on the fork, and on a basis of the image, transfers the object to be transferred, in a posture corrected based on the calculated amount of position misalignment, to a process module connected to the second transfer module.

12. The processing system of claim 11, wherein the image sensor is installed on a transfer path of the object to be transferred.

13. The processing system of claim 11, wherein the transferer transfers into the chamber the object to be transferred in a posture corrected based on the amount of the position misalignment calculated by the calculator.

14. The processing system of claim 13, wherein the image sensor is installed on a transfer path of the object to be transferred.

15. The processing system of claim 11, wherein the annular structure is an edge ring or a cover ring.

16. The processing system of claim 11, wherein the calculated amount of position misalignment includes misalignment in the horizontal direction and the rotational direction of the object to be transferred.

17. The processing system of claim 11, wherein the image sensor is movable in a horizontal direction within the second transfer module.

* * * * *